US005491710A

United States Patent [19]
Lo

[11] Patent Number: 5,491,710
[45] Date of Patent: Feb. 13, 1996

[54] STRAIN-COMPENSATED MULTIPLE QUANTUM WELL LASER STRUCTURES

[75] Inventor: Yu-Hwa Lo, Ithaca, N.Y.

[73] Assignee: Cornell Research Foundation, Inc., Ithaca, N.Y.

[21] Appl. No.: 238,500

[22] Filed: May 5, 1994

[51] Int. Cl.⁶ ............................ H01S 3/085; H01S 3/06; H01S 3/18
[52] U.S. Cl. .................. 372/45; 372/96; 257/18
[58] Field of Search ........................... 372/96, 102, 45, 372/46, 43, 92; 257/18

[56] References Cited

U.S. PATENT DOCUMENTS

| | | | |
|---|---|---|---|
| 4,800,100 | 1/1989 | Herbots et al. | 427/38 |
| 4,815,083 | 3/1989 | Hayashi | 372/45 |
| 4,826,282 | 5/1989 | Alferness | 372/102 |
| 4,881,235 | 11/1989 | Chinone et al. | 372/46 |
| 5,034,958 | 7/1991 | Kwon et al. | 372/45 |
| 5,070,509 | 12/1991 | Meyers | 372/96 |
| 5,103,456 | 4/1992 | Scifres et al. | 372/50 |
| 5,131,001 | 7/1992 | Carlson | 372/50 |
| 5,159,603 | 10/1992 | Kim | 372/45 |
| 5,164,949 | 11/1992 | Ackley et al. | 372/45 |
| 5,164,956 | 11/1992 | Lang | 372/96 |
| 5,181,086 | 1/1993 | Yoshida | 257/18 |
| 5,204,870 | 4/1993 | Faist et al. | 372/45 |
| 5,212,702 | 5/1993 | Choquette | 372/45 |
| 5,251,225 | 10/1993 | Eglash et al. | 372/45 |
| 5,255,278 | 10/1993 | Yamanaka | 372/45 |
| 5,363,392 | 11/1994 | Kusakawa | 372/45 |
| 5,373,166 | 12/1994 | Buchan et al. | 257/18 |
| 5,392,306 | 2/1995 | Usami et al. | 372/45 |

OTHER PUBLICATIONS

Miller et al., "Strain–Compensated Strained–Layer Superlattices for 5 um Wavelength Lasers", Appl. Phys. Lett 58 (18), pp. 1952–1954, May, 1991.

Seltzer et al., "Zero–Net–Strain Multiquantum Well Lasers", Electronics Letters, vol. 27, No. 14, pp. 1268–1270, Jul., 1991.

Briggs et al., "Gain and Threshold Characteristics of Strain–Compensated Multiple–Quantum–Well Lasers", IEEE Photonics Technology Letters, vol. 4, No. 5, pp. 423–425, May 1992.

Kasukawa et al., "Very Low Threshold Current Density 1.5 um GaInAs/AlGaInAs Graded–Index Separate–Confinement–Heterostructure Strained Quantum Well Lawer Diodes Grown By Organometallic Chemical Vapor Deposition", Appl. Phys. Lett. 59 (20), pp. 2486–2488, Nov., 1991.

Primary Examiner—Rodney B. Bovernick
Assistant Examiner—Robert McNutt
Attorney, Agent, or Firm—Jones, Tullar & Cooper

[57] ABSTRACT

Semiconductor laser structures utilize strain-compensated multiple quantum wells as the laser gain medium to greatly increase the gain and substantially reduce mirror reflectivity constraints in long wavelength (1.3 and 1.55 μm) surface emitting, and other, lasers. The strain-compensated multiple quantum well structures include a plurality of quantum well barrier layer pairs with each quantum well layer being placed under strain and each barrier layer being placed under an equal and opposite strain so that the net overall strain on the quantum well structure is zero. As a result, it can be made as thick as necessary for the lasers to operate efficiently at long wavelengths. Each of the quantum well layers are also preferably p-doped to further increase the optical gain. Another embodiment of the present invention employs the strain-compensated multiple quantum wells in combination with grating-coupling in a surface or edge emitting laser. The gratings are formed on top of the multiple quantum well structure to simplify the fabrication process, and are provided with strong light coupling characteristics to reduce the overall width of the laser structure to as low as 10 microns.

10 Claims, 5 Drawing Sheets

STRAIN-COMPENSATED MULTIPLE QUANTUM WELL LASER STRUCTURES

BACKGROUND OF THE INVENTION

The present invention relates in general to semiconductor laser structures which incorporate strain-compensated multiple quantum wells as the laser gain medium.

High speed lasers are useful in optical communications, optical interconnects and many military applications. As data rates for commercial communication systems increase rapidly to multi-gigabits per second, the need for ultrafast lasers (>30 GHz bandwidth) will likely increase rapidly also. Vertical cavity surface emitting lasers (VCSELs) have even broader applications although the cost and performance of such devices until now has been a limiting factor. Long wavelength (e.g., 1.3 or 1.55 µm) vertical cavity lasers have a single longitudinal mode characteristic similar to that of distributed feedback (DFB) lasers, these being the most important light sources for advanced fiber communication systems. Commercial DFB lasers cost $2,000 to $6,000 each because of the extremely sophisticated fabrication process and very time consuming screening test employed in their production period. Vertical cavity surface emitting lasers are easier to fabricate than DFB lasers, but have not been able to match their performance characteristics. If their performance characteristics could be substantially improved, however, the demand for such lasers will likely increase exponentially and eventually dominate the market of lasers used for fiber communications.

Recent advances in GaAs/AlGaAs VCSELs have provided the structures with a number of advantages, including low threshold current, single mode behavior, circular beam pattern, high packing density and relatively simple fabrication processing. These advantages make them particularly attractive in many applications including optical communications, optical interconnects, optical computing and displays. However, because of the material property constraints, the development of InP-based long wavelength (e.g. 1.55 µm) VCSELs is far behind that of its short wavelength (0.8 to 1 µm) counterpart. These constraints result from a number of difficulties including low mirror reflectivity, high cavity loss mainly due to intervalence band absorption, strong Auger recombination and large valence band discontinuity which increases the series resistance tremendously. These difficulties must be overcome if long wavelength VCSELs are to become a feasible alternative to DFB lasers in optical communications and other applications.

Meanwhile, manufacturers continue to look for ways to reduce the cost of semiconductor lasers by reducing their size and complexity. Unfortunately, the goals of increased operating speed, VCSELs which operate efficiently at longer wavelengths and reduced size and fabrication costs tend to work against each other when applied to known laser structures. As a result, there exists a substantial need for a new type of laser structure which can achieve all of these goals simultaneously.

SUMMARY OF THE INVENTION

In view of the foregoing, the present invention seeks to provide laser structures which fulfill this need. This is achieved by providing laser structures with a high gain medium that compensates for optical losses that result when the lasers are designed for long wavelength operation, or are made smaller. The resulting increased optical gain and differential gain also facilitates higher speed operation.

To increase the optical gain substantially, the present invention makes use of a gain medium comprising a plurality of strained quantum wells. It is known that the optical gain for strained quantum wells is substantially higher than that of unstrained quantum wells. However, it has not been possible before to employ such strained quantum wells in long wavelength VCSELs because of the critical thickness constraint. The critical thickness is defined as the thickness above which dislocations and other defects will form between the layers of quantum wells, and these defects must be avoided in VCSEL structures. Unfortunately, long wavelength VCSELs require a relatively thick gain medium to compensate for their high mirror loss. If a thick gain medium is used, the mirror losses are spread out over the thickness of the gain medium so that the resulting effective mirror loss is reduced to an acceptable level. In long wavelength VCSELs, this required thickness of the gain medium dictates that a large number of strained quantum wells, far above the critical thickness, are required to achieve lasing.

To solve this problem, the present invention employs multiple strained quantum wells which are strain-compensated, thereby lifting the critical thickness constraint and permitting the use of the requisite number of quantum wells. Each of the strain-compensated quantum wells actually comprises a quantum well layer and a barrier layer. The quantum well layer is strained, for example, by applying a compressive force thereto, while the adjacent barrier layer is placed in tension with an equal and opposite force so that it cancels the compressive strain imparted on the quantum well. This results in the pair of layers having a zero net strain. In this manner, a plurality of the strained quantum well-barrier layer pairs can be stacked on one another with no strain buildup.

The thickness of the gain medium created by stacking a plurality of the quantum well/barrier layer pairs reduces the effective mirror loss of the resulting VCSEL structure. In addition, the strained quantum wells provide a substantially high optical gain which further overcomes the mirror losses, as well as the high cavity losses. To further enhance the gain and to suppress Auger recombinations so that the threshold current of the resulting device remains low even with a relatively high mirror loss, the quantum wells can also be p-doped. P-doping further raises the gain and differential gain. This is important because with a large number of strained quantum wells, hole transport becomes a problem because they have trouble getting through the wells, and p-doping facilitates the hole transport.

In another embodiment of the present invention, grating-coupling is employed to reduce the size of the resulting laser structure substantially due to the strong light coupling through metal gratings disposed on the output surface of the laser. The use of strongly coupled, high loss gratings is made possible by the high gain of the strain-compensated multiple quantum well gain medium. Using silver gratings, the series resistance of this device is very small because silver forms a natural ohmic contact with the underlying semiconductor laser structure that alleviates the heat dissipation problem and yields a good thermal stability. The fabrication process of the grating-couple device is greatly simplified compared to conventional distributed feedback lasers which use embedded gratings lasers because it does not require cleaving, mirror coating and regrowth on corrugated surfaces. Using the grated-coupled SEL structure, two dimensional laser arrays can be achieved with excellent wavelength spacing control. Finally, this structure permits easy on-wafer testing and wafer-scaled wavelength mapping that are critically important during the device fabrication process.

BRIEF DESCRIPTION OF THE DRAWINGS

The foregoing and additional features and advantages of the present invention will become apparent from the following detailed description of a number of preferred embodiments thereof, taken in conjunction with the accompanying drawings, in which.

DETAILED DESCRIPTION OF THE PREFERRED EMBODIMENTS

A number of key concepts will first be explained before a detailed consideration of the preferred embodiments of the present invention and variations thereon will be described. It is well known that strained quantum wells have a much higher optical gain than unstrained quantum wells and bulk semiconductor material. However, only a few strained quantum wells can be gown due to the critical thickness constraint. This is because each time another strained quantum well layer is added to one or more additional strained quantum well layers, the overall strain imparted to the resulting layered structure increases. The critical thickness of the structure is defined to be the thickness above which the strain becomes so great that misfit dislocations and other defects are formed between the layers, thereby making the structure unusable, especially for optical purposes.

The critical thickness constraint causes a low confinement factor for in-plane lasers and high effective mirror losses for VCSELs since the effective mirror loss is directly proportional to the total mirror loss divided by the length of the gain medium, which is the total thickness of the layered quantum well structure. However, the critical thickness constraint does not apply to strain-compensated multiple quantum wells because the strain in each well is completely balanced by an equal and opposite strain in an adjacent barrier layer. As a result, the strain-compensated multiple quantum well structure creates both high gain and high confinement factor for in-plane lasers, and high gain and low effective mirror loss for VCSELs.

Figure 1:
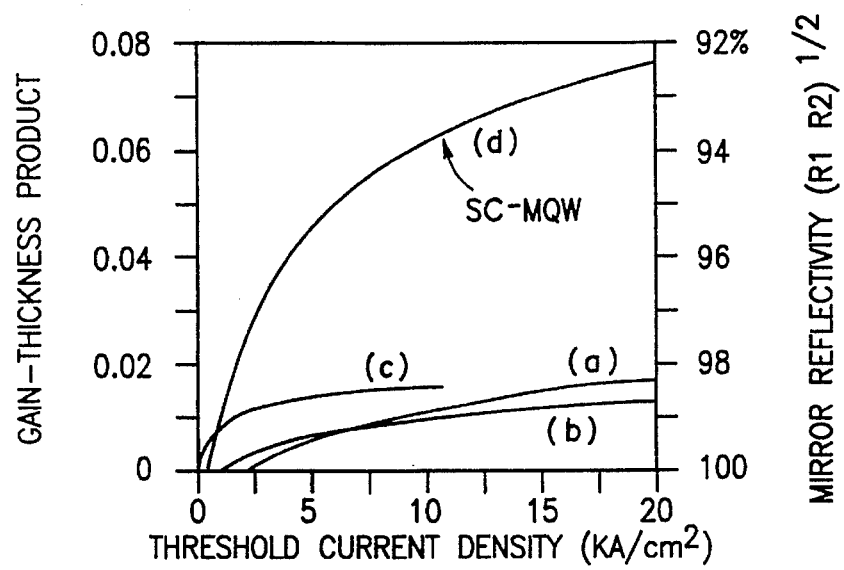
FIG. 1 is a graph illustrating the dependence of gain-thickness product on current density, and of the current density on mirror reflectivity for semiconductor lasers constructed in accordance with the present invention and in accordance with a number of prior art semiconductor laser designs.
Figure 2:
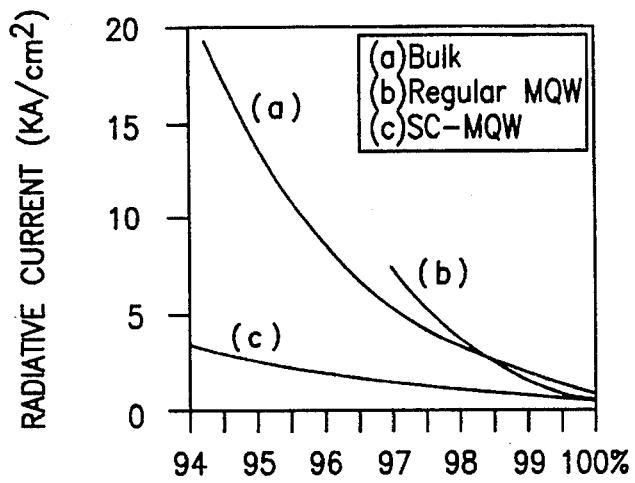
FIG. 2 is a graph illustrating the dependence of radiative current on mirror reflectivity for semiconductor laser structures constructed in accordance with the present invention and in accordance with two prior art semiconductor laser designs.
Figure 3:
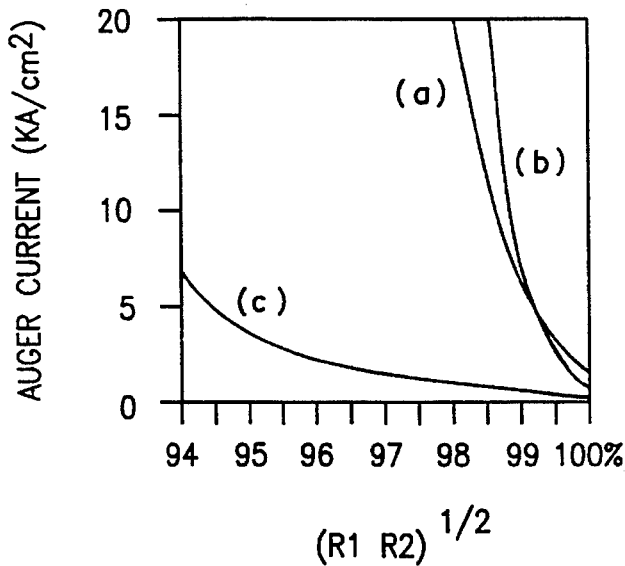
FIG. 3 is a graph illustrating the dependence of Auger recombination current on mirror reflectivity for semiconductor laser structures constructed in accordance with the present invention and in accordance with two prior art semiconductor laser designs.

The graph in FIG. 1 illustrates the dependence of gain-thickness product on current density which is the sum of radiative and Auger recombination current densities. Since mirror loss is the dominant loss mechanism for long wavelength VCSELs, the gain-thickness product is proportional to $1 - \sqrt{R_1 R_2}$, where $\sqrt{R_1 R_2}$ is the mirror reflectivity of the laser, and FIG. 1 also shows the threshold current density as a function of mirror reflectivity. It is apparent from FIG. 1, that lasers having gain mediums formed from bulk semiconductors, lattice-matched multiple quantum wells or strained multiple quantum wells (curves a, b and c, respectively), cannot operate with a mirror reflectivity substantially lower than 99% since the threshold current density requirements become impossibly high. On the other hand, it is apparent by referencing curve d in FIG. 1 that a gain medium employing strain-compensated multiple quantum wells can easily operate with a mirror reflectivity as low as 94% with a threshold current density of only 9 Ka/cm$^2$. The graphs in FIGS. 2 and 3 illustrate that the strain-compensated multiple quantum well gain medium provides a much lower radiative current and a much lower Auger current as a function of mirror reflectivity than do lasers constructed with either a bulk semiconductor gain medium or a regular multiple quantum well gain medium.

Long wavelength (e.g., 1.3 or 1.55 μm) VCSELs typically have Bragg mirror reflectivity lower than 99%, high cavity loss mainly due to intervalence band absorption, strong Auger recombination and large valence band discontinuity which increases the series resistance tremendously. It is therefore clear from an inspection of the graphs of FIGS. 1–3 that prior art VCSELs have been unsuitable for operation at long wavelengths. On the other hand, it is also apparent from FIGS. 1–3 that use of a gain medium comprising strain-compensated multiple quantum wells solves this problem.

Figure 4:
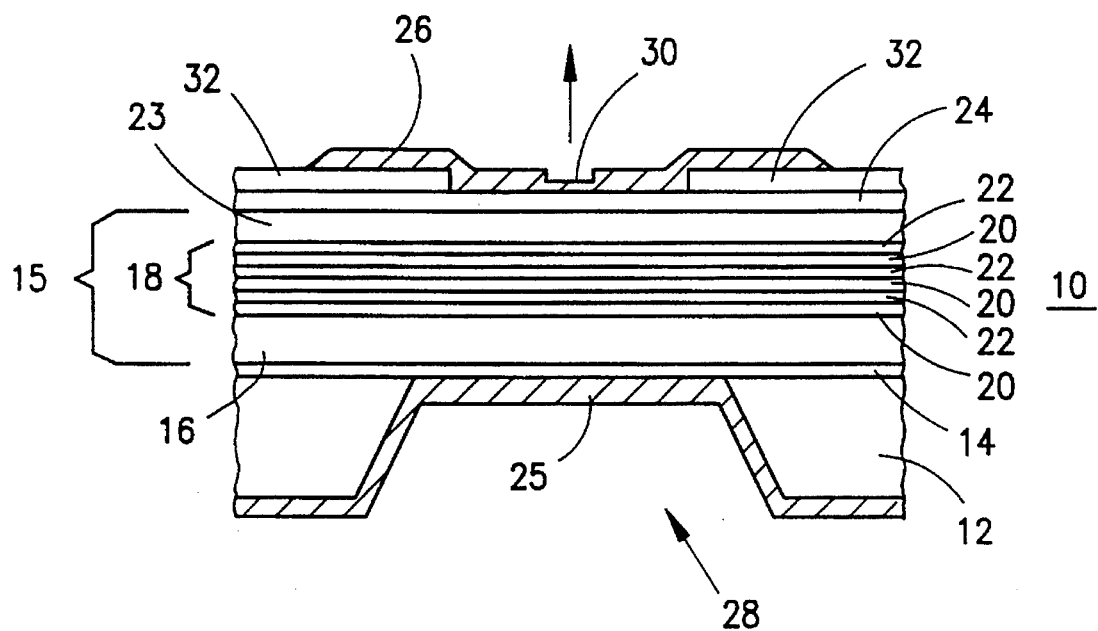
FIG. 4 is a schematic side view of a semiconductor laser constructed in accordance with a first preferred embodiment of the present invention.

Turning now to FIG. 4, a first preferred embodiment incorporating the concepts of the present invention is illustrated. In particular, a long wavelength VCSEL 10 is shown which includes a semiconductor substrate 12, which is formed from InP. Other materials for the substrate 12 can be employed, depending upon the operating wavelength of the VCSEL 10. InP is employed for long wavelength lasers of either 1.3 or 1.55 μm. For very long wavelengths in the infrared region, e.g. 2.0–5.0 μm, the substrate 12 is preferably made from InAs or GaSb. On the other hand, for very short wavelengths of less than 0.5 μm, ZnSe or GaP are used in the substrate 12. When conventional GaAs substrate material can only be employed for wavelengths around 0.8 μm, the present invention does not need to be employed.

A number of layers are formed on the substrate 12. These include an n-type contact layer 14 on which is formed a laser body 15 that forms the vertical laser cavity for the VCSEL 10. Incorporated in the laser body 15 is a first injection layer 16, which can be formed from n-type InP or InCaAsP; a strain-compensated multiple quantum well structure 18 including a plurality of quantum well layers 20 which alternate with a plurality of barrier layers 22; and a second injection layer 23, which can be formed from p-type InP or InGasP. A p-type contact layer 24 is disposed on top of the laser body 15.

The multiple quantum well structure 18 is fabricated using any conventional known technics so that compressive (or tensive) strain is imparted to each of the quantum well layers 20, while an equal and opposite tensive (or compressive) strain is imparted to each of the barrier layers 22 so that the net overall strain imparted to the multiple quantum well structure 18 is zero. As a result, the multiple quantum well structure 18 can be formed with any desired number of the quantum well layers 20, regardless of the critical thickness constraint. In the preferred embodiment of the present invention where the VCSEL 10 is specifically designed as a long wavelength, single frequency laser operating at a wavelength of either 1.3 or 1.55 µm, between 20 and 30 of the quantum well layers 20 are provided in the multiple quantum well structure 18 along with a equal number of the barrier layers 22. Each of the quantum well layers 20 has a thickness of approximately 35 angstroms, while each of the barrier layers has a thickness of approximately 60 angstroms so that the total thickness of each well/barrier layer pair is approximately 95 angstroms, and the total thickness of the multiple quantum well structure 18 is approximately between 0.2 and 0.3 µm.

Preferably, quantum well layers 20 are made of InGaAs, InGaAsP, InGaAlAs or any other compounds suitable for use on InP substrates, while the barrier layers 22 are formed from InGaAsP or InAlGaAs. Although the strain imparted to the quantum wells 20 greatly improves the resulting optical gain of the VCSEL 10, each of the quantum well layers 20 are also preferably p-doped (approximately $1\times10^{12}$ cm$^{-2}$ for each quantum well layer) to further enhance the gain and the differential gain. As a result, an optical gain well above 10,000 cm$^{-1}$ can be achieved at a relatively low carrier concentration. Because of the low carrier concentration, the Auger recombinations will not be the dominant factor for the threshold current and the VCSEL 10 can operate efficiently at long wavelengths. The increased differential gain also enables the VCSEL 10 to be operated at very high speeds, e.g., in excess of 30 GHz.

The VCSEL 10 also includes a bottom thin film metal mirror 25 which is formed in contact with the n-type contact layer 14 and a top metal thin film mirror 26 which is formed in contact with the p-type contact layer 24. Both of the mirrors 25 and 26 are preferably formed of silver. To make the bottom mirror 25, a notch 28 is cut out of the InP substrate 12 by any suitable process, such as wet chemical etching, and then the silver is deposited by evaporation. The light output of the VCSEL 10 exits through the top surface as indicated by the arrow in FIG. 1 of the top mirror 26 through a thinned portion 30 thereof that has a thickness on the order of the skin depth which is approximately 25 nm for silver (about 15% coupling). A silicon dioxide layer 32 is formed over the p-type contact layer 16 in those areas not covered by the top mirror 26 which serves as a current blocking layer.

For the silver/air interfaces at the top and bottom mirrors 26 and 25, the reflectivity is approximately 97.8% at a 1.55 µm wavelength. However, the reflectivity at the silver/semiconductor interfaces drops to 94% because of the high refractive index of the semiconductor in the laser body 15. Regardless of this low reflectivity, the VCSEL 10 can operate efficiently because of the high gain of the strain compensated multiple quantum well structure 18.

Figure 5:
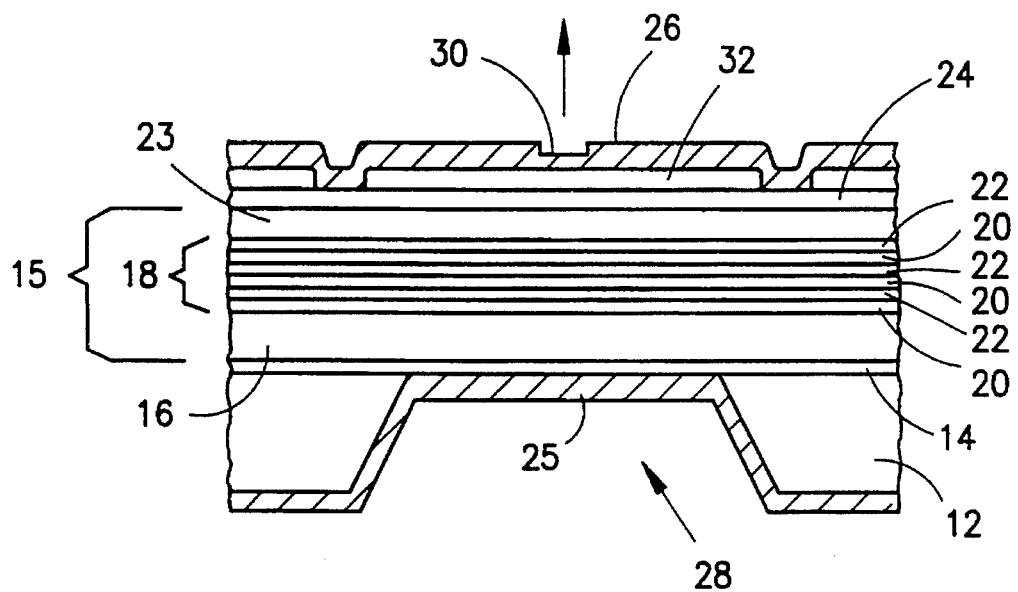
FIGS. 5–9 are schematic side views of a number of variations of the structure of FIG. 4.

It is nevertheless possible to increase the performance of the VCSEL 10 further by improving the mirror reflectivity. This can be accomplished easily by using an index matching method that is embodied in the variation of the structure illustrated in FIG. 5. In particular, the VCSEL 10 in FIG. 5 has been modified so that the silicon dioxide layer 32 extends between the p-type contact layer 24 and the top mirror 26 which provides a much better refractive index match than is obtained when the mirror 26 is deposited directly on the p-type contact layer 24. Furthermore, the introduction of the silicon dioxide layer 32 in the laser cavity creates an intracavity effect which can also contribute to the increase of the reflectivity. A detailed analysis shows that use of the silicon dioxide reflection enhancement layer can raise the mirror reflectivity from 94% to 98.6% over a broad long wavelength range from approximately 1.4 to 1.6 µm. Consequently, the threshold current density can be reduced as low as 1.3 KA/cm$^2$, thereby resulting in a sub-miliamp threshold current.

FIGS. 6–9 illustrate variations on the structure of FIG. 1 which employ different types of mirrors. It should be noted that different mirror designs, such as semiconductor Bragg mirrors, dielectric mirrors, and silver mirrors are exchangeable in most of these structures. Since all of the VCSELs 10 have strain-compensated multiple quantum wells as the gain medium, the mirror reflectivity can be chosen over a wide range to optimize the device characteristics, such as the output power.

Figure 6:
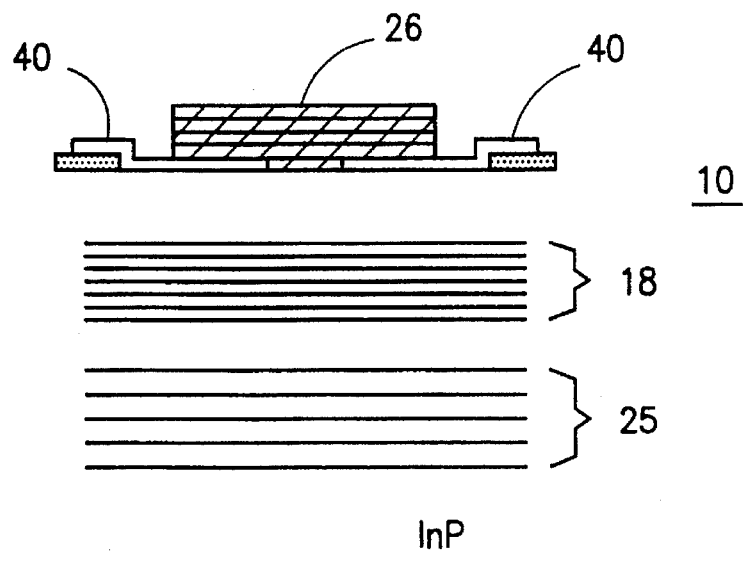

Referencing FIG. 6 specifically, the top mirror 26 is a dielectric mirror with a pair of silver electrodes 40 and the bottom mirror 25 is a semiconductor Bragg mirror which can be formed from InP/InGaAsP, for example. The resulting structure is gain guided and can be easily fabricated with standard processing.

Figure 7:
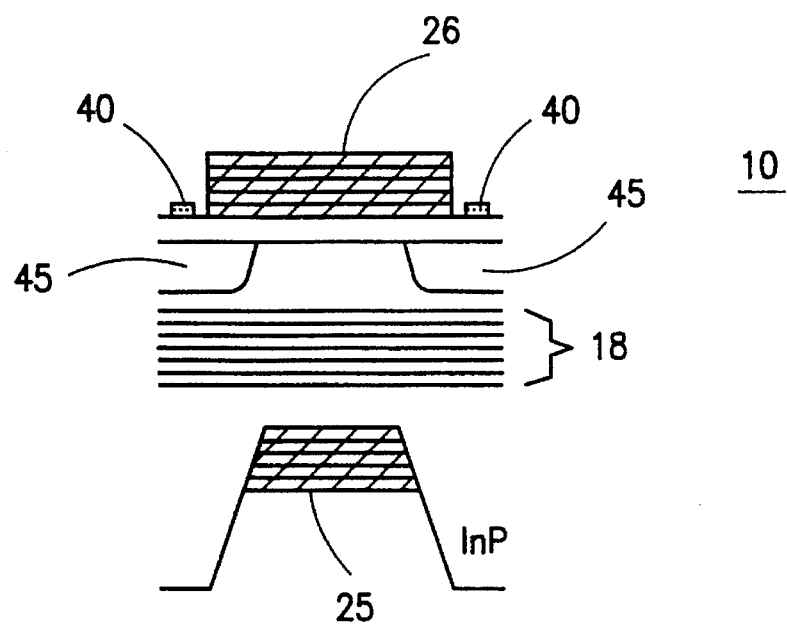

FIG. 7 illustrates a variation in which both of the bottom and top mirrors 25 and 26 are formed from dielectric material. This structure has very good carrier confinement and lateral mode properties because it includes a buried heterostructure 45.

Figure 8:
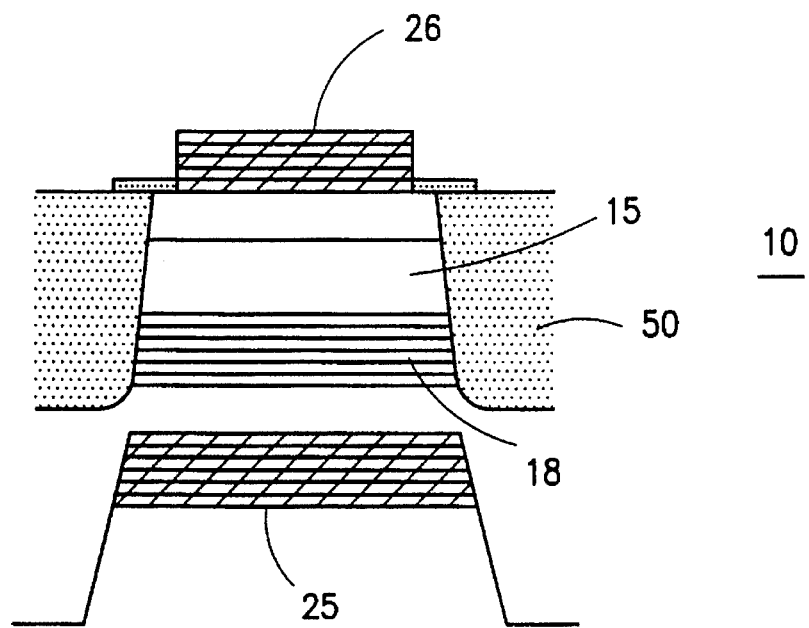

The variation illustrated in FIG. 8 also employs dielectric mirrors. In addition, the laser body 15 is formed as an etched mesa surrounded with a polyimide region 50. This structure can also be easily fabricated with standard processing.

Figure 9:
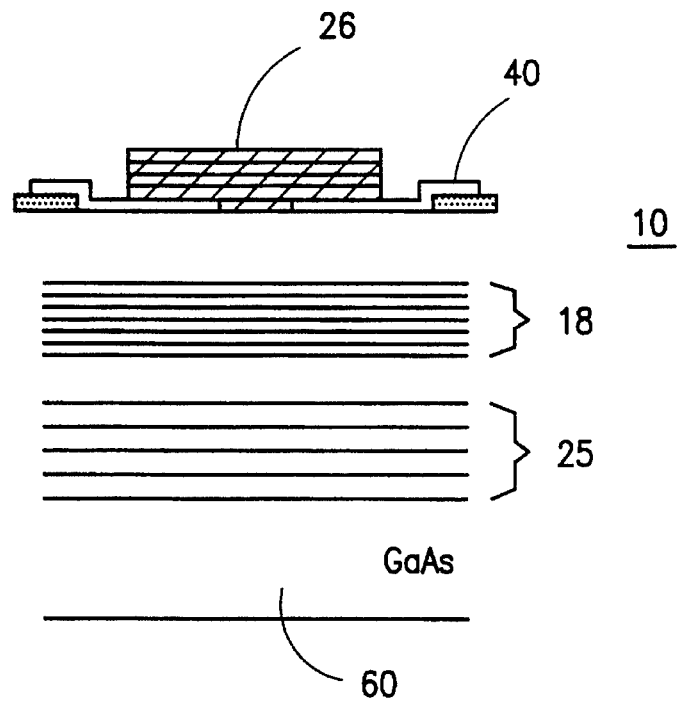

Finally, the variation illustrated in FIG. 9 employs a dielectric mirror as the top mirror 26, but the bottom mirror 25 is formed from a bonded GaAs/AlAs Bragg mirror on a GaAs substrate 60. This structure therefore uses conventional GaAs technology for a substantial portion of the structure.

Figure 10:
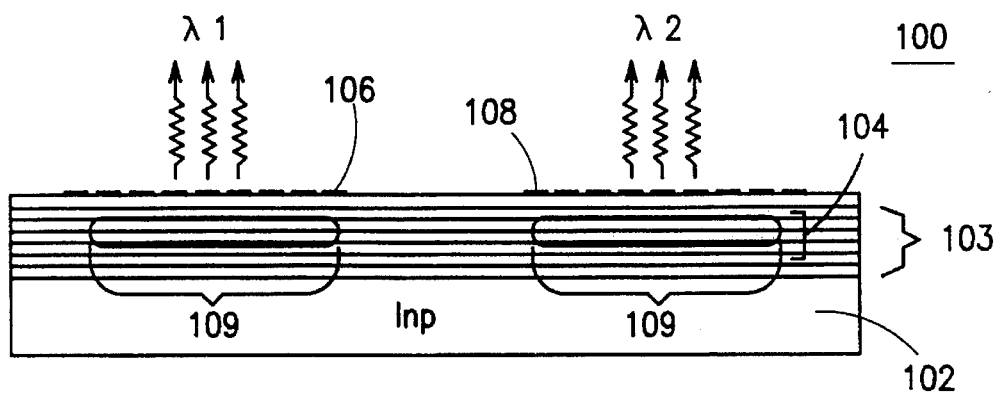
FIG. 10 is a schematic side view of a first variation of a semiconductor laser constructed in accordance with a second preferred embodiment of the present invention.
Figure 11:
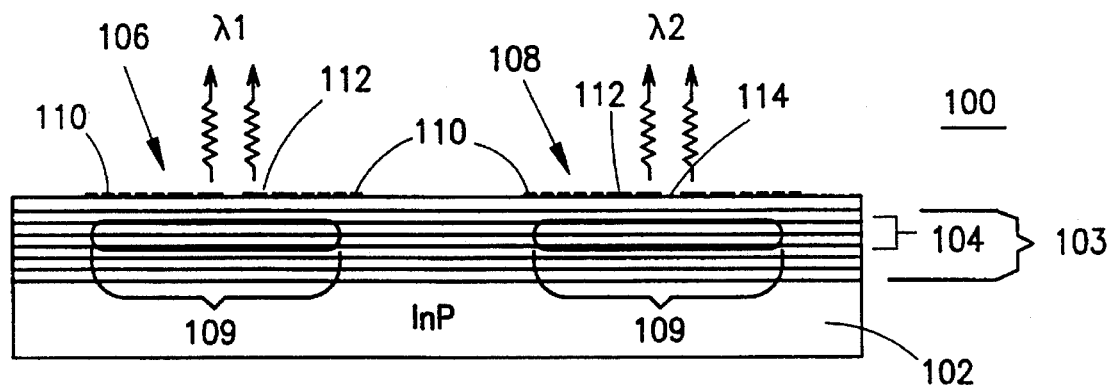
FIG. 11 is a schematic side view of a second variation of the second preferred embodiment.
Figure 12:
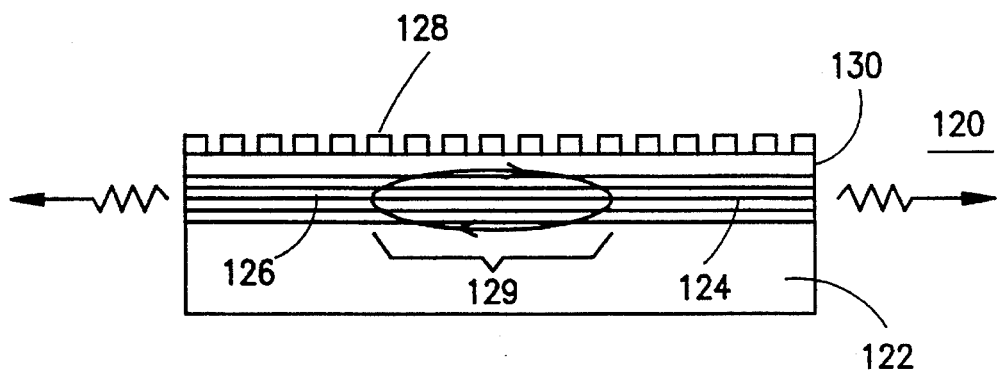
FIG. 12 is a schematic side view of a third variation of the second preferred embodiment.

Turning now to FIGS. 10–12, three variations of a second preferred embodiment of the present invention are illustrated. In particular, this embodiment of the present invention uses grating-coupling. Although conventional distributed feedback lasers also employ grating-coupling, their gratings are embedded which requires a complicated fabrication process including cleaving, mirror coating and regrowth on corrugated structures. In addition, the gratings in DFB lasers typically have weak coupling strength to avoid high losses, and therefore require a long interaction length, thus making the resulting device relatively large.

In contrast, all of the variations of the second preferred embodiment of the present invention illustrated in FIGS. 10–12 employ silver gratings that are formed on the top surface of the devices, thereby greatly simplifying the fabrication process because it does not require cleaving, mirror coating and regrowth on corrugated structures. The coupling strength of the gratings can also be greatly increased since all of the variations employ strain-compensated multiple quantum well gain media and high losses are therefore not a problem. As a result of the very strong coupling, the devices can be made much smaller than conventional DFB lasers, on the order of 10 to 20 microns.

With specific reference now to each variation of the second preferred embodiment, FIG. 10 shows a surface emitting laser 100 comprising an InP substrate 102 on which is formed a laser body 103 including a strain-compensated multiple quantum well structure 104 that is formed in essentially the same manner as the multiple quantum well structure 18 of the first preferred embodiment and its variation illustrated in FIGS. 4–9. Formed on top of the laser body 103 are first and second silver gratings 106 and 108, both of which are second order diffraction gratings. As indicated by the beam path lines in FIG. 10, use of second order diffraction gratings results in formation of a horizontal laser cavity 109, but vertical coupling of laser light from the cavity through the top surface of the structure 100. The first grating 106 is tuned to emit light of a first wavelength, while the second grating 108 is tuned to emit light of a second wavelength, thus making the SEL 100 particularly useful for wavelength division multiplexing (WDM) applications. As stated before, the SEL 100 can be made very compact due to the strong light coupling through the gratings 106 and 108, and by way of example, the overall width of the gratings 106 and 108 and horizontal cavity 109 can be on the order of approximately 20 microns. The series resistance of the SEL 100 is only a few ohms because silver forms a natural ohmic contact with $p^+$-InGaAsP, which alleviates the heat dissipation problem and yields a good thermal stability.

In the variation illustrated in FIG. 11, the diffraction gratings 106 and 108 include both first and second order gratings 110 and 112, with a phase shift region 114 in the middle of the second order grating 112. Use of the first order gratings 110 at the ends of the horizontal laser cavity 109 improves efficiency of the optical feedback which causes the light to travel back and forth in the horizontal cavity. The second order grating 112 is employed only for vertical coupling of the emitted laser beam. Finally, the phase shift region 114, where the spacing of the gratings in the second order grating 112 is altered, is provided to merge two degenerate light wavelengths into one so that only one wavelength is emitted by the laser structure 100. Because of the increased efficiency of the first order grating 110, the laser structure 100 in FIG. 11 can be made as small as 10 microns, with an actual beam spot size as small as 2 to 3 microns.

FIG. 12 shows a variation in which an edge emitting laser 120 is formed in essentially the same manner as the laser 100 of FIGS. 10 and 11. In particular, the laser 120 includes an InP substrate 122, a laser body 124 containing a strain-compensated multiple quantum well structure 126, and a first order diffraction grating 128. The first order diffraction grating 128 causes the laser light to travel back and forth in a horizontal cavity 129 in the strain-compensated multiple quantum well structure 126, and allows some portion of the light to be coupled out from the side surfaces 130 of the laser structure 120. Again, this structure is very easy to fabricate, can be made very small and can be operated at a very high speed.

Although the present invention has been described in terms of a number of preferred embodiments, it will be understood that numerous other modifications and variations could be made thereto without departing from the scope of the invention as set forth in the following claims.

What is claimed is:

1. A semiconductor vertical cavity surface emitting laser structure comprising:

a) a substrate;

b) a laser body on said substrate;

c) a strain-compensated multiple quantum well structure in said laser body and forming a gain medium for said laser structure; and d) first and second reflective means positioned below and above, respectively, said strain-compensated multiple quantum well structure for forming a vertical cavity for said laser structure in said laser body.

2. The laser structure of claim 1, wherein said strain-compensated multiple quantum well structure includes a plurality of p-doped quantum well layers.

3. The laser structure of claim 1, wherein said multiple quantum well structure includes a plurality of strained quantum well layers alternating with a plurality of oppositely strained barrier layers.

4. The laser structure of claim 1, wherein said laser structure is a single frequency laser operating at a wavelength of at least approximately 1.3 µm.

5. The laser structure of claim 1, wherein said first and second reflective means further comprise:

i) a first reflective mirror layer between said substrate and said laser body; and ii) a second reflective mirror layer on top of said laser body.

6. The laser structure of claim 5, further including an index matching layer between said laser body and said second reflective mirror.

7. The laser structure of claim 1, wherein said first reflective means comprises a semiconductor Bragg mirror, and said second reflective means comprises a dielectric mirror.

8. The laser structure of claim 1, wherein said first and second reflective means comprise first and second dielectric mirrors.

9. The laser structure of claim 1, wherein said first reflective means comprises a bonded Bragg mirror disposed between said substrate and said laser body.

10. The laser structure of claim 9, wherein said substrate is formed from GaAs, and said bonded Bragg mirror is formed from GaAs/AlAs.

* * * * *